United States Patent [19]

Neuman

[11] 3,996,537
[45] Dec. 7, 1976

[54] NOISE SUPPRESSION FILTER

[75] Inventor: Werner E. Neuman, Deerfield, Ill.

[73] Assignee: Corcom, Inc., Chicago, Ill.

[22] Filed: July 21, 1975

[21] Appl. No.: 597,319

[52] U.S. Cl. .................................. 333/78; 333/77
[51] Int. Cl.² ...................... G05F 3/04; H03H 7/00
[58] Field of Search .................... 333/79, 77, 78, 12

[56] References Cited
UNITED STATES PATENTS 2,957,087  10/1960  Goto .................................... 333/78
3,683,271  8/1972  Kobayashi .......................... 333/78

Primary Examiner—Alfred E. Smith
Assistant Examiner—David K. Moore
Attorney, Agent, or Firm—Howard H. Rogers, Jr.

[57] ABSTRACT

A two line power filter for digital equipment or the like comprising a pair of toroidal cores on both of which both wires are wound, on one in flux adding relationship and on the other in flux opposing or cancelling relationship in reference to the primary power supply, together with capacitive shunts between the wires and from the wires to ground to filter out both common mode and differential mode noise.

5 Claims, 3 Drawing Figures

NOISE SUPPRESSION FILTER

BACKGROUND OF THE INVENTION

Digital equipment both generates and is highly susceptible to transients and high frequency noise in the 100 KHz range and upward. The generated or received noise, which may be derived from other digital apparatus in the same power system, breaks down into two components. Considering a two line power supply, one component will consist of noise injected into the power current flow and distorts the power current wave form. The other component of the noise is particularly incident to the high speed switching of digital equipment which creates high frequency biases in both conductors simultaneously with respect to ground. The first of these is identified as differential mode noise and the second as common mode noise.

SUMMARY OF THE INVENTION

The present invention is directed to a passive L-C power line filter for such apparatus as digital equipment or other noise-susceptible or noise-generating apparatus to be inserted between the power supply and the equipment to filter both incoming and outgoing power line voltages in respect to both differential mode noise and common mode noise. Basically it consists of a pair of toroidal cores as the inductive elements, on each of which the two power supply lines are wound, on one of the cores in the same direction of winding and on the other core in the opposite direction of winding, together with associated capacitive line-to-line and line-to-ground shunts to provide a simple, inexpensive, and compact filter which nevertheless screens out effectively both modes of noise either from delivery into or out of the equipment.

DESCRIPTION OF A PREFERRED EMBODIMENT

Figure 1:
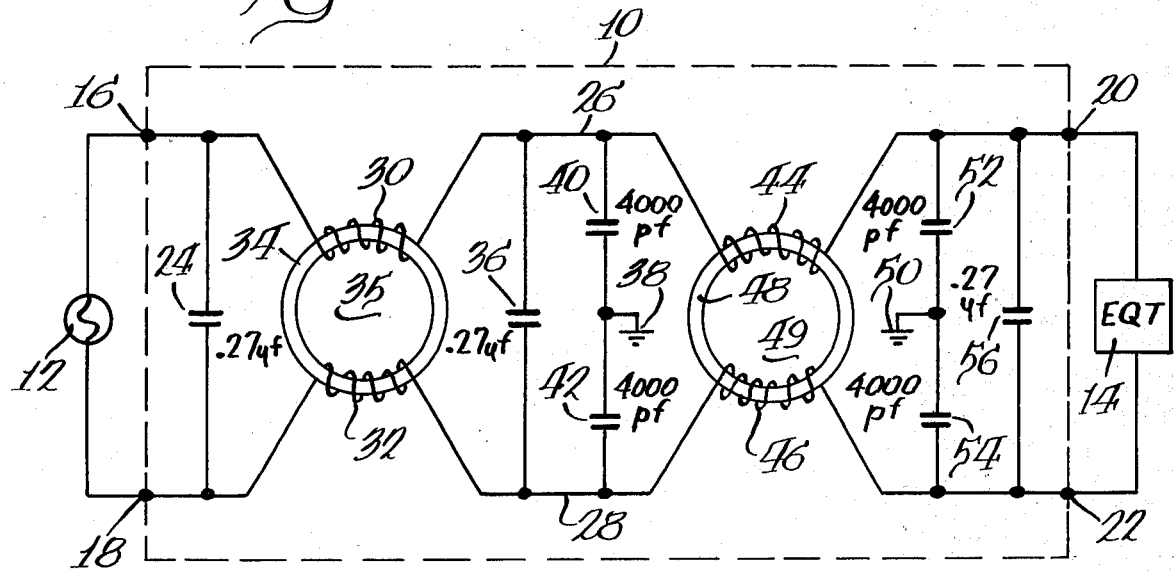
FIG. 1 is a circuit diagram illustrating an embodiment of this invention.

The filter 10 indicated by the dashed lines is situated between a power source 12 and the load or equipment 14, digital or otherwise. The power may be 110 volts or 240 volts indifferently. Even though one side of a 120 volt line is nominally "ground", the power current wave forms in it are identical to those in the "hot" line, and noise can and does appear in it and potential differences exist between it and earth ground.

Viewing the elements of the filter 10 in succession, going from the input terminals 16 and 18 to the output terminals 20 and 22 thereof, a relatively large capacitor 24 shunts across the two lines 26 and 28. The two lines are next identically wound as at 30 and 32 on a low permeability toroidal core 34, to define an inductor 35, with the same direction of wind and the same number of turns such that the 60 Hz current-induced fluxes add. A second large capacitor 36 is connected in shunt across the two lines on the other side of the inductor 35.

Next, the two lines 26 and 28 are each shunted to ground 38 through relatively small, like capacitors 40 and 42, series-connected across the two lines. The two lines then are each wound as at 44 and 46 on a high permeability toroidal core 48 to define an inductor 49. The windings of this core are inductively opposite with respect to each other and are equal in number of turns so that the 60 Hz current-induced fluxes cancel each other.

On the other side of the inductor 49, the two lines are again shunted to ground 50 through capacitors 52 and 54 series-connected across the lines, similar to capacitors 40 and 42, and again shunted across with another capacitor 56 like capacitors 24 and 36. The two lines then lead to the output terminals which in turn are connected to the equipment 14.

A representative filter may have the following values: the high valued capacitors 24, 36, and 56, 0.27 uf; the low valued capacitors 40, 42, 52, and 54, 4000 pf. The low permeability core 34 will have a value of from 10 to 100. An air gap may be employed in the core to reduce the permeability toward the low end. The inductance of the inductor 35 with respect to either winding 30 or 32 may be 10 to 100 uH. The core 48 will have a permeability of 1000 to 10,000. The inductance of the inductor 49 comprising core 48 will be 0.5 to 5 mH with respect to either winding 44 or 46.

Before getting into the operation of the filter, the design considerations of the filter in reference to delivering power efficiently to the equipment should first be considered. The inductor 35, as stated, is of relatively low value, and while the coils 30 and 32 are wound thereon in a way to generate aiding fluxes within the core 34 in regard to the 60 Hz current, the low value offers minimal impedance to the 60 Hz current.

The low value of inductor 35 is a consequence of physical design considerations in that a high valued inductor, so wound, to accommodate the substantial power requirements of the equipment, must be physically large and expensive. Thus, design considerations for the differential mode noise filter, which includes the inductor 35 and the capacitors 24, 36, and 56 shunting between the lines, requires, in addition to the relatively small inductor, relatively large-valued capacitors.

On the other hand, since the 60 Hz current generates opposing or cancelling fluxes within the core 48, the windings on that core do not generate inductive reactance in respect to line frequency and the windings, therefore, are the substantial equivalent of a short circuit thereacross. Since inductor 49 does not appear to the line current as an inductance and since it appears as an inductance only to the common mode noise which involves only a minor amount of power, the value of the inductor 49 may be high without being physically large. Since the inductance of the inductor 49 is high, the capacitors 40, 42, 52, and 54 associated with it may be and desirably are of low value. These capacitors exist for the purpose of shunting common mode noise to ground. Since those capacitors are charged not only with high frequency noise but line voltage with respect to ground, any defect in the ground wiring could present a hazard to the user if the capacitors were high valued.

Figure 2:
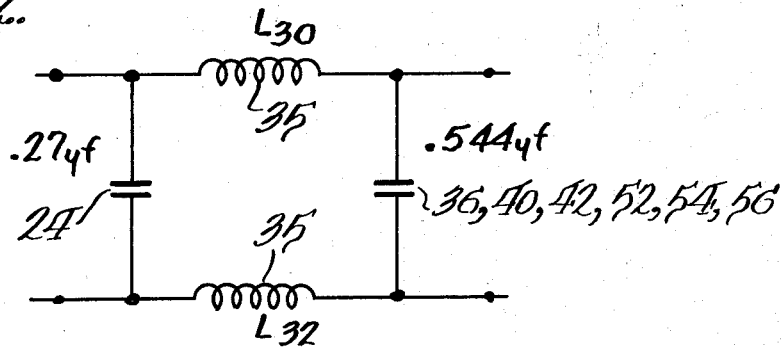
FIG. 2 is a schematic of the filter as it presents itself to differential mode noise and FIG. 3 is a schematic of the filter as it presents itself to common mode noise.

As regards the two modes of noise, then, the differential mode noise or the noise that exists in the current flow will see the inductor 35 and, basically, the line shunting capacitors 24, 36, and 56, so defining, in simplified form, a balanced pi filter wherein the two windings 30 and 32 on the inductor 34 and the capacitances to the right of the inductor are respectively additive. (FIG. 2).

Since the differential mode noise is noise injected into the power current, it will see the inductor as the 60 Hz current sees it, as a reactive element, only, of course, as a much higher reactance by virtue of its frequency. The small capacitors 40, 42, 52, and 54 shunting across the lines also add to the capacitance value to the right of the inductor, but as they are relatively small compared to the value of capacitors 36 and 56, they contribute only negligibly. Since the differential mode noise is in the current flow, the fluxes generated by the opposing windings in the core 48 cancel each other as with the undistorted 60 Hz current, and differential noise, therefore, sees the inductor 48 as substantially a short circuit.

Figure 3:
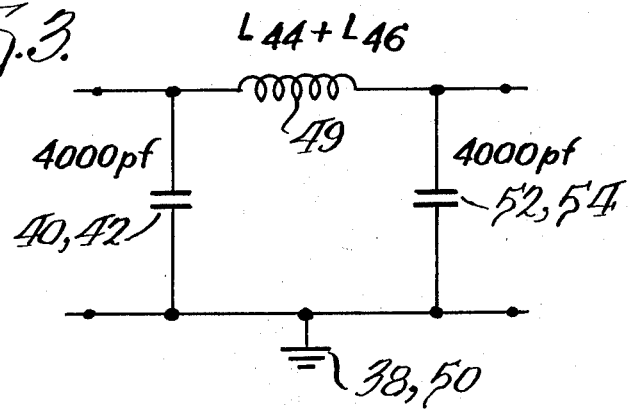

Common mode noise, or like noise on both lines with respect to ground, sees the windings on core 48 as producing aiding fluxes within that core. In other words, if the two windings on the core are such that they are cancelling with a through-passage of current, one line to the load to the other line, they will be aiding with respect to the parallel passage of identical currents through the two lines. Since the windings on core 34 produce aiding fluxes with respect to line current, common mode noise will produce opposing fluxes in that core, and thus inductor 35 appears to this mode of noise as substantially a short circuit. Thus, common mode noise will likewise see a pi filter (FIG. 3) consisting of the inductor value of the additive windings on the core 48 and shunts to ground of the capacitive sums of the capacitors 40, 42, 52, and 54. The capacitors 24, 36, and 56 will not appear to common mode noise because no potential difference arises.

It will be appreciated that noise generated, for example, by digital equipment will not generate pure differential mode or common mode noise, but any noise generated is analyzable into these two modes. The concern in this invention is that a filter directed to the elimination of differential mode noise will be ineffective in filtering out common mode noise and vice versa. The invention here permits efficient power transfer to the equipment while at the same time suppressing both aspects of noise whether arising within the equipment or outside the equipment and does so in a compact and inexpensive unit.

It will be appreciated that the exact configuration and values given for the components above are illustrative only and are not to be regarded as limitative. They will vary according to the power, the efficiency of power transfer desired, the allowable size and cost of the unit, the nature and intensity of the noise, the frequencies to be eliminated, and the narrowness of the transition zone between transmitted frequencies and absorbed frequencies.

The filter may be more or less complex than that shown. Additional L and C components may be added in well known configurations for greater complexity. The device may be simplified, for example, by the elimination of the capacitors 36, 40, and 42 and the ground connection 38. This will have the effect of converting the common mode noise aspect of the filter into an "L" configuration. Other modifications will undoubtedly suggest themselves.

I claim:
1. A power line filter for digital equipment and the like which comprises a pair of power transmission lines for delivering alternating current from a source of power to said equipment, a first toroidal core of relatively low permeability, each of said lines being wound on said core to produce aiding fluxes within said core in response to said alternating current, a second toroidal core of substantially greater permeability, each of said lines being wound on said second core to produce opposing fluxes within said core in response to said alternating current, a capacitive shunt between said lines, and a capacitive shunt between each of said lines and ground.

2. The combinations of claim 1 wherein the capacitive shunt between said lines is relatively large and the capacitive shunt between each of said lines and ground is relatively small.

3. The combination as set forth in claim 1 wherein the number of turns of one of said lines on each of said cores is equal to the number of turns of the other line on each of said cores.

4. The combination of claim 2 wherein said large capacitive shunt comprises capacitors distributed with respect to said first core to define therewith a pi filter and said small capacitive shunt comprises capacitors distributed with respect to said second core to define therewith a pi filter.

5. The combination of claim 1 wherein the inductance of said first core with respect to one of the windings thereon is in the vicinity of 10 to 100 uH and the inductance of said second core with respect to one of the windings thereon is in the vicinity of 0.5 to 5 mH.

* * * * *